(12) United States Patent
Veil et al.

(10) Patent No.: US 10,140,226 B2
(45) Date of Patent: Nov. 27, 2018

(54) CONTROL APPARATUS WITH LOAD MONITORING

(71) Applicant: Pilz GmbH & Co. KG, Ostfildern (DE)

(72) Inventors: Richard Veil, Ostfildern (DE); Bernd Harrer, Ostfildern (DE)

(73) Assignee: PILZ GMBH & CO. KG, Ostfildern (DE)

( * ) Notice: Subject to any disclaimer, the term of this patent is extended or adjusted under 35 U.S.C. 154(b) by 258 days.

(21) Appl. No.: 15/090,661

(22) Filed: Apr. 5, 2016

(65) Prior Publication Data

US 2016/0217088 A1 Jul. 28, 2016

Related U.S. Application Data

(63) Continuation of application No. PCT/EP2014/071422, filed on Oct. 7, 2014.

(30) Foreign Application Priority Data

Oct. 9, 2013 (DE) .................. 10 2013 111 179

(51) Int. Cl.
*G06F 13/20* (2006.01)
*G05B 19/042* (2006.01)
(Continued)

(52) U.S. Cl.
CPC ......... *G06F 13/20* (2013.01); *G05B 19/0428* (2013.01); *G06F 13/4068* (2013.01);
(Continued)

(58) Field of Classification Search
CPC ..... G06F 13/20; G06F 13/40; G05B 19/0428; G05B 2219/25004; G05B 2219/25034; H05K 7/1471
See application file for complete search history.

(56) References Cited

U.S. PATENT DOCUMENTS

| | | | | | |
|---|---|---|---|---|---|
| 5,195,528 | A | * | 3/1993 | Hok | A61B 5/0816 |
| | | | | | 128/204.23 |
| 5,907,194 | A | * | 5/1999 | Schenk | H02P 9/307 |
| | | | | | 180/65.1 |

(Continued)

FOREIGN PATENT DOCUMENTS

| | | |
|---|---|---|
| DE | 10 2005 055 325 B3 | 4/2007 |
| DE | 10 2006 052 039 A1 | 5/2008 |

(Continued)

OTHER PUBLICATIONS

English language translation of International Preliminary Report on Patentability (Chapter I) for PCT/EP2014/071422; dated Apr. 12, 2016; 17 pp.

(Continued)

*Primary Examiner* — Henry Tsai
*Assistant Examiner* — Christopher A Daley
(74) *Attorney, Agent, or Firm* — Harness, Dickey & Pierce, P.L.C.

(57) ABSTRACT

A modular control apparatus, having a head module, and at least one supply module and peripheral module arranged on the head module and having a bus structure. The supply module and the peripheral module have a base module part, an electronic module part and a connection module part. The base module parts are arranged next to one another and provide the bus structure that electrically couples the head module, the supply module and the peripheral module to one another. The supply module additionally comprises an electrical line that runs from the connection module part through the electronic module part to the base module part and connects the supply connection of the supply module to the bus structure. An overload identification unit is arranged at the electrical line and determines a parameter of the elec- (Continued)

trical line and produces a warning signal if the parameter exceeds a threshold value.

17 Claims, 6 Drawing Sheets

(51) Int. Cl.
*H05K 7/14* (2006.01)
*G06F 13/40* (2006.01)

(52) U.S. Cl.
CPC . *H05K 7/1471* (2013.01); *G05B 2219/25004* (2013.01); *G05B 2219/25034* (2013.01)

(56) References Cited

U.S. PATENT DOCUMENTS

| | | | |
|---|---|---|---|
| 7,933,104 B2 | 4/2011 | Bauer et al. | |
| 8,891,220 B2 | 11/2014 | Shimizu et al. | |
| 9,112,318 B2 | 8/2015 | Cech et al. | |
| 9,731,610 B2* | 8/2017 | Reichow | B60L 11/1811 |
| 2011/0131455 A1 | 6/2011 | Law et al. | |
| 2013/0222959 A1 | 8/2013 | Sawyers et al. | |
| 2013/0336359 A1* | 12/2013 | Zink | G01K 7/023 |
| | | | 374/152 |
| 2014/0266269 A1* | 9/2014 | Ausserlechner | G01R 1/203 |
| | | | 324/713 |
| 2014/0364057 A1* | 12/2014 | Schumann | H04Q 9/00 |
| | | | 455/41.1 |
| 2014/0368258 A1* | 12/2014 | Willkofer | H01L 23/34 |
| | | | 327/513 |

FOREIGN PATENT DOCUMENTS

| | | |
|---|---|---|
| DE | 10 2010 001 275 A1 | 2/2011 |
| DE | 10 2010 038 459 A1 | 2/2012 |
| DE | 11 2010 003 841 T5 | 12/2012 |
| DE | 10 2011 110 184 A1 | 2/2013 |
| EP | 1 771 054 A2 | 4/2007 |
| EP | 2 620 820 A2 | 7/2013 |
| JP | H0887307 A | 4/1996 |
| JP | H11223653 A | 8/1999 |
| JP | 2011066881 A | 3/2011 |
| JP | 2012147556 A | 8/2012 |
| WO | 98/26640 | 6/1998 |
| WO | WO-2005003869 A1 | 1/2005 |

OTHER PUBLICATIONS

PSSuniversal; Programmable Control systems PSS®, System Description—No. 21256-EN-04; Oct. 2010; 89 pp.
International Search Report for PCT/EP2014/071422; dated Dec. 23, 2014; 2 pp.

* cited by examiner

US 10,140,226 B2

CONTROL APPARATUS WITH LOAD MONITORING

CROSS-REFERENCES TO RELATED APPLICATIONS

This application is a continuation of international patent application PCT/EP2014/071422, filed on Oct. 7, 2014 designating the U.S., which international patent application has been published in German language and claims priority from German patent application DE 10 2013 111 179.3, filed on Oct. 9, 2013. The entire contents of these priority applications are incorporated herein by reference.

BACKGROUND OF THE INVENTION

This disclosure relates to a modular control apparatus, particularly a safety switching apparatus. The modular control apparatus has a head module, at least one supply module and at least one peripheral module, which are arranged next to one another on the head module.

The disclosure additionally relates to a supply module for such a control apparatus.

The applicant markets modular control apparatuses of the above-mentioned type under the name of PSS Universal, as described in the system description, No. 21256-EN-04 from the applicant.

A control apparatus can be for instance a modular control apparatus for a configurable or programmable controller. A control apparatus is made up in modular fashion from a central head unit and modules arranged next to one another. The modules are connected to one another and to the head module via a separate bus. The modules are predominantly input and output modules that can be used to connect the peripherals to be controlled. Therefore, the input and output modules are often also referred to as peripheral modules. Input modules pick up signals from the external peripherals, for example signaling devices such as door contact switches, light barriers or emergency off switches. The output modules are used to control, and if need be supply current to, connected actuators, for example contactors, solenoid valves and lamps. The current required for this purpose is provided for the output modules via the supply modules.

The supply modules, like input and output modules, are arranged on the control apparatus and connected to the shared bus. External connections on the supply modules can be used to supply a peripheral current to the control apparatus, and the bus can be used to forward said peripheral current to the appropriate output modules. The peripheral current is provided by external power supply units, which convert a mains voltage of 230 volts AC into a corresponding operating voltage of 24 volts DC, for example. The power supply units are designed to provide different current levels and have protected mechanisms, for example in the form of fuses, that trip and interrupt the current path to the control unit when a certain threshold value is exceeded.

Usually, multiple output modules are supplied with current by a single supply module, as is also described in the system description of the PSS Universal No. 21256-EN-04 cited at the outset. In addition, within a control apparatus, different potential groups are formed that are each made up of a supply module and associated output modules. The modules of one potential group are arranged contiguously on the bus, each potential group beginning with a supply module. The more output modules are associated with a single supply module, the higher, usually, the current that a supply module picks up externally.

Particularly in the case of power peaks, for example when switching on and off, the load can become too high for a supply module, so that either an internal fuse or an external fuse of the external power supply unit trips and isolates the control apparatus and/or individual potential groups. This can fundamentally prevent the control apparatus or individual modules from becoming damaged. Uncontrolled disconnection of this kind is undesirable, however, and has an adverse effect on the availability of the overall system.

SUMMARY OF THE INVENTION

It is therefore an object to specify a control apparatus that reacts to an overload. It is another object to react to an overload in a better and safer manner.

According to one aspect of the invention there is provided a modular control apparatus of the type cited at the outset, wherein the at least one supply module and the at least one peripheral module have at least one base module part, an electronic module part and a connection module part, wherein the connection module part of the at least one supply module has a supply connection for supplying an external peripheral current, wherein the connection module part of the at least one peripheral module provides an output for connecting an actuator for outputting the peripheral current supplied to the supply module, wherein the base module parts arranged next to one another provide the bus structure that electrically couples the head module, the at least one supply module and the at least one peripheral module to one another, wherein the supply module additionally has: an electrical line, having a defined cross section, that runs from the connection module part through the electronic module part to the bus module part and connects at least one supply connection of the supply module to the bus structure, and an overload identification unit that is arranged at the electrical line and determines a parameter of the electrical line and produces a warning signal if the parameter exceeds a threshold value.

According to a further aspect of the present invention there is provided a supply module for a modular control apparatus that has a head module and at least one peripheral module that are coupled to one another via a bus structure, wherein the supply module has a base module part, an electronic module part and a connection module part having at least one supply connection, and also an electrical line, having a defined cross section, that runs from the connection module part through the electronic module part to the bus module part and connects the at least one supply connection of the supply module to the bus structure, and having an overload identification unit that is arranged at the electrical line and determines a parameter of the electrical line and produces a warning signal if the parameter exceeds a threshold value.

According to a further aspect of the present invention there is provided a method for supplying a peripheral current to a modular control apparatus, having the steps of: providing a modular control apparatus having a head module, at least one supply module and at least one peripheral module, which are arranged next to one another on the head module, wherein the at least one supply module and the at least one peripheral module have at least one base module part, an electronic module part and a connection module part, providing a bus structure from the base module parts arranged next to one another that electrically couples the head module, the at least one supply module and the at least one peripheral module to one another, providing an electrical line in the at least one supply module having an overload identification unit, wherein the electrical line has a defined cross section and runs from the connection module part through the electronic module part to the bus module part and connects the at least one supply connection of the supply module to the bus structure, receiving of an external peripheral current via a supply connection on the connection module part of the at least one supply module, outputting the peripheral current via an output on the connection module part of the at least one peripheral module, defining a threshold for a parameter of the electrical line, determining the parameter of the electrical line by the overload identification unit, and generating a warning signal by the overload identification unit if the parameter exceeds the threshold value.

It is hence an idea to propose a modular control apparatus in which the supply modules and peripheral modules are of modular design and comprise at least one base module part, an electronic module part and a connection module part. The base module parts of the supply and peripheral modules, which parts are arranged next to one another, form the "backbone" of the control apparatus, with a bus structure that connects the individual modules to one another and to the head module of the control apparatus. Preferably, the base module parts are in the same form for both supply modules and peripheral modules. The actual function of the modules is determined by the electronic module part plugged onto the base module part. The electronic module part is the centerpiece of a module and provides the definitive processing device, such as the logic and switching apparatus of a peripheral module, for example. Furthermore, the modules have a further connection module part that can be used to set up a connection to the external peripherals. In the case of input modules, this module part is used to couple external signaling devices to the control apparatus. In the case of output modules, the connection module part is used to connect the external peripheral elements to be controlled to the control apparatus, and if need be to supply them with current. By way of example, the external peripheral elements may be connected actuators such as contactors, solenoid valves or lamps.

In the case of supply modules, the connection module part comprises at least one supply connection for picking up an external peripheral current. In addition, an electrical line having a defined cross section is routed from the supply connection in the connection module part through the electronic module part to the bus in the base module part. This electrical line preferably carries the entire supplied peripheral current that is required for supplying current to the external peripherals connected to the output modules. Hence, the sum of all the peripheral currents provided by the output modules flows via the electrical line.

In addition, the electrical line has an overload identification unit arranged at it which continuously determines at least one characteristic parameter of the electrical line. The parameter may be a value that relates directly to the physical state of the electrical line, for example the current in the line, or else a value that relates to the surroundings of the electrical conductor and provides information about the current utilization level of the electrical line. In addition, a threshold value for this parameter is specified, defining the point from which the electrical line and hence also the supply module are in a critical state, whereupon a warning signal is generated by the overload identification unit, which is preferably immediately displayed or is made available to the head module. It is therefore an idea to continuously monitor the supply module and particularly the components charged by the external peripheral current and, in the event of an overload appearing, to take action in good time before an uncontrolled disconnection of the control apparatus occurs. Uncontrolled disruptive failure of the control apparatus can thus be prevented.

In a refinement, the head module disconnects the actuator on at least one output of the at least one peripheral module on the basis of the warning signal.

The warning signal produced by the overload identification unit is therefore forwarded to the head module via the internal bus. The head module, which corresponds to the "brain" of the control apparatus, can take the warning signal as a basis for specifically either disconnecting peripheral elements at the relevant outputs or transferring them to another, power-saving state. As a result, the load of a single supply module can be reduced and the control apparatus remains available. Furthermore, the head module can generate a warning signal for the user, so that the latter can react accordingly and, by way of example, provides an additional supply module for the control apparatus before failure occurs.

In a further refinement, the overload identification unit has a temperature sensor, particularly an NTC resistor, for determining a temperature value for the electrical line.

The parameter to be determined by the overload identification unit is a temperature value for the electrical line. This value is preferably determined by an NTC resistor that is arranged in proximity to the electrical line. The advantage of temperature measurement is that, besides the value of the current that is characteristic of the load, the external conditions are also taken into account at the same time. Thus, the load through the electrical conductor and the time at which critical failures occur are dependent not only on the actual flow of current in the conductor but also, in particular, on external circumstances too. The temperature measurement in proximity to the electrical line therefore allows indirect determination of a reliable parameter for the actual load of the electrical conductor and of the supply module.

In a preferred refinement, the temperature sensor is thermally coupled to the electrical line but is galvanically isolated from the electrical line.

This refinement has the advantage that the load on the electrical line can be identified with certainty from the temperature value, but the temperature sensor itself and also the associated overload identification unit are arranged so as to be protected from the line in respect of electromagnetic compatibility. An electrical overload on the electrical line therefore cannot damage the temperature sensor and the overload identification unit.

In a further refinement, the overload identification unit is arranged at a distance from the electrical line, but the distance corresponds to no more than three times the defined cross section of the electrical line.

The overload identification unit is therefore not directly connected to the electrical line, but is rather arranged within a maximum distance from the latter, so that a reliable statement can be made about the actual load on the electrical line.

In a further refinement, the overload identification unit determines at least one second parameter, which is of a different kind than the first and which corresponds particularly to the current through the electrical line.

This refinement has the advantage that a further parameter is sensed preferably by a separate sensor, which is independent of the sensor for the first parameter. Preferably, this second parameter is the current that flows through the electrical line. By way of example, said current can be determined by means of a Hall Effect sensor or by means of a shunt resistor. Whereas a Hall effect sensor is, on principle, galvanically isolated from the electrical line, with a shunt resistor it is necessary to bear in mind that said shunt resistor additionally requires separate galvanically isolation between the electrical line and the overload identification unit. In comparison with the Hall Effect sensor, a shunt resistor is cheaper to produce, however. The measurement of a second parameter allows the load of a supply module to be evaluated more accurately. Particularly if the first parameter is a temperature value and the second parameter represents the flow of current in the electrical line, it is possible to establish whether an increased temperature value can actually be attributed to the electrical load of the electrical line or else whether the temperature rise is brought about by external conditions.

In a further refinement, the electrical line has a first and at least one second parallel-connected conductor track.

This refinement is particularly advantageous in order to better distribute the load on the electrical line. Since the electrical line is preferably a conductor track having a defined width and height, it is advantageous if the current can be distributed to a further conductor track, for example on the back of the printed circuit board. It is likewise conceivable for still further conductor tracks to be connected in parallel beside the second conductor track in order to split the load further. These further conductor tracks may be laid in the internal layers of the printed circuit board, for example.

In a further refinement, the at least one peripheral module has the first output and at least one second output, the first and second outputs being electrically connected to the electrical line of the supply module.

The output module has not only one output but rather preferably a multiplicity of outputs that can be controlled separately, for example via semiconductor switches. This embodiment allows the control apparatus to be advantageously designed in more compact form.

In a further refinement, the electronic module part of the supply module has a male connector and the base module part of the supply module has a corresponding mating connector that, when put together, produce a plug connection that electrically couples the electrical line to the bus structure, the overload identification unit being arranged at the plug connection in galvanically isolated fashion but at a maximum distance that corresponds to three times the cross section of the electrical line.

The overload identification unit, particularly the sensor that is relevant to determine the parameter, is arranged at a critical location within the supply module at which an overload on the electrical line has a particular effect. On plug connections, a higher level of contact resistance can be expected, for example in the case of wear at the contact points as a result of frequent insertion and removal. An increased contact resistance results in an increased line resistance, which means that particularly high power loss, for example in the form of the production of heat, can be expected for a higher load at this location. The arrangement of the overload identification unit at this critical location is therefore particularly advantageous in order to identify possible breakdown in good time.

It goes without saying that the features cited above and those yet to be explained below can be used not only in the respectively indicated combination but also in other combinations or on their own without departing from the scope of the present disclosure.

DESCRIPTION OF PREFERRED EMBODIMENTS

Figure 1:
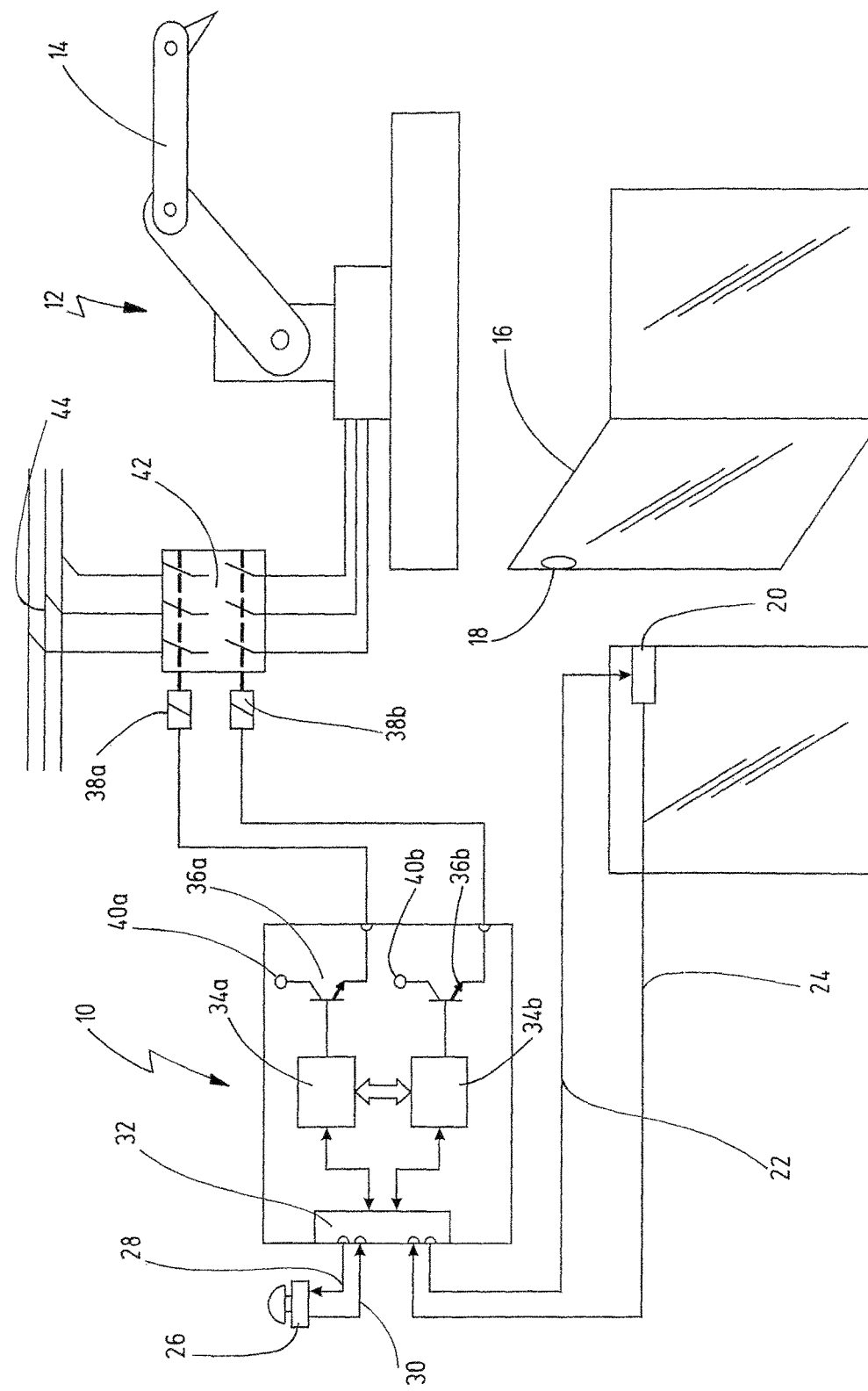
FIG. 1 shows a simplified illustration of a preferred exemplary embodiment of the novel control apparatus.

In FIG. 1, an exemplary embodiment of the novel control apparatus is denoted in its entirety by the reference numeral 10. The exemplary embodiment shown is a safety switching apparatus, which in this case is used to protect a technical installation 12. In this example, the technical installation 12 is a robot 14 operating in automated fashion whose danger area is limited by a guard door 16 in order to protect persons. The guard door has a door contact switch on it with an actuating element 18 and a sensor 20. While the actuating element is in the sensing range of the sensor, the guard door is closed. When the guard door is opened and the actuating element 18 is removed from the sensing range of the sensor 20, the sensor detects these changes and signals the unsafe state to the safety switching apparatus.

In the example shown here, the sensor 20 is a passive sensor that is connected to the modular control apparatus via a first line 22 and a second line 24. In this context, passive means that the sensor 20 does not autonomously generate a signal that represents the present state of the guard door, but rather it is supplied with a control signal by the modular control apparatus 10 via the line 22. While the control signal is returned from the sensor to the modular control apparatus 10 via the line 24 in unaltered form when the guard door is closed, the signal flow is interrupted when the guard door is open. In the latter case, the signal transmitted by the control apparatus is therefore not applied to the inputs of the control apparatus again. As a further example of a signaling device, FIG. 1 additionally shows an emergency off switch 26. Like the door contact switch, the emergency off switch 26 is a passive signaling device and connected to the modular control apparatus via two lines 28, 30 in the same way. Alternatively, an active sensor may also be connected to the control apparatus, such as a light barrier or a light curtain, for example, which autonomously produce a corresponding enable signal. Active signals are also referred to as OSSD sensors, OSSD standing for "Output Signal Switching Device".

Regardless of the type of sensors, the enable signals from the signaling devices 16, 26 are picked up by the inputs 32 of the modular control apparatus and processed by the modular control apparatus 10. In the present exemplary embodiment, the input signals are processed by two redundant microcontrollers 34a, 34b that evaluate the input signals independently of one another and decide whether the technical installation 12 needs to be shut down or alternatively transferred to a safe state. In this case, shutdown is effected via two semiconductor switches 36a, 36b, which are each connected to a contactor 38a, 38b.

In a safe state, i.e. when the enable signals from the signaling devices 20, 26 are applied to the inputs 32 correctly, the semiconductor switches 36a, 36b are switched by the microcontrollers 34a, 34b such that the contactors 38a, 38b are supplied with current. The operating contacts 42 of the contactors 38a, 38b are additionally connected in series in the current path between the power supply 44 and the technical installation 12. When the contactors 38a, 38b are in the state supplied with current, a solenoid preferably pulls the mechanical contacts 42 into the active state, i.e. the current path from the power supply 44 to the technical installation 12 is closed and the robot is operational. When the guard door is opened and/or the emergency off switch 26 is operated, the contactors are isolated by the modular control apparatus 10, with the redundant design of the microcontrollers 34a, 34b, semiconductor switches 36a, 36b and contactors 38a, 38b ensuring that at least one contactor 38a, 38b becomes isolated, even if there is a fault in the other channel. Since the operating contacts 42 of the contactors are connected in series, it is sufficient if only one contactor releases in order to isolate the robot 14.

The current that is needed for actuating the contactors is provided by the control apparatus via the outputs and subsequently referred to as peripheral current. In this case, the supply of current is indicated by the connections 40a, 40b. How the control apparatus provides the current is explained in more detail below with reference to FIG. 2.

Figure 2:
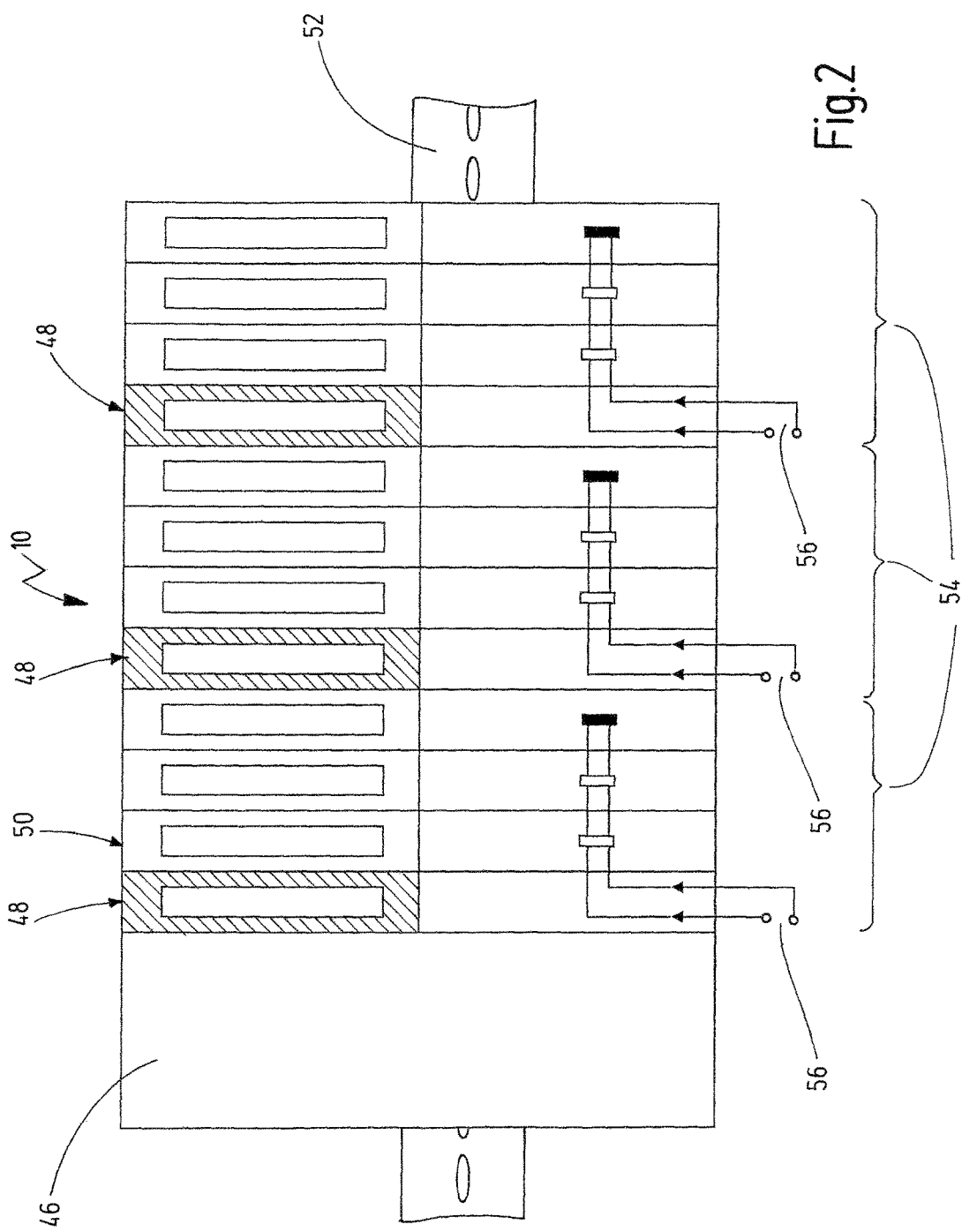
FIG. 2 shows a schematic illustration of a preferred exemplary embodiment of the novel modular control apparatus.

FIG. 2 shows an exemplary embodiment of the novel modular control apparatus 10 with a head module 46 and a multiplicity of coordinate supply and peripheral modules 48, 50. The head module 46 is preferably arranged at the edge of the modular control apparatus 10 and has communication interfaces, not shown in more detail here, in order to connect the sensor and actuator level to superordinate controllers. A connection can be made using popular field bus systems for standard control functions or else using special safe bus systems, such as SafetyBus p, for example, for safety-oriented functions. A head module therefore comprises at least one central processing unit and interfaces for communication.

Beside the head module 46, twelve single modules are shown in this case, which are arranged next to one another in a row. These are three supply modules 48 and nine peripheral modules 50. The head module 46 and the further modules are preferably plugged onto a top hat rail 52. The modules are connected to one another and to the head module via a bus, which is not shown in more detail here. The modules are in a form such that the bus automatically expands when new modules are added. The bus is firstly used to interchange data between the head module and the individual modules and also between the modules, and secondly, the individual modules can be supplied with current via the bus. While the processing units of the individual modules are supplied with an adequate operating voltage from the head module, peripheral modules that additionally supply current to external peripherals require the provision of special supply modules 48 in order to provide the necessary voltage.

A supply module 48 can supply multiple peripheral modules 50 with an appropriate peripheral current. Within the control apparatus 10, there are preferably multiple supply modules 48 provided, either in order to create different potential groups with different peripheral currents or in order to distribute the load over multiple supply modules. In this case, a potential group is understood to mean a supply module 48 with the associated peripheral modules 50 that are supplied with current via the supply module. In the exemplary embodiment shown in FIG. 2, the modular control unit is divided into three potential groups. The peripheral modules 50 are assigned to a supply module 48 preferably by the order in which the modules are arranged next to one another. Alternatively, it is naturally also possible for assignment to be effected by specific wiring or other circuitry.

A supply connection 56 on the supply modules 48 is used by an external power supply unit to supply the peripheral current. In this case, the current is transmitted from one module to the module situated next to it via the bus until a new supply module 48 appears in the row. The peripheral modules 50 tap off the peripheral current via the bus and forward it to the connected external peripherals, as explained in more detail below by means of FIG. 3.

Figure 3:
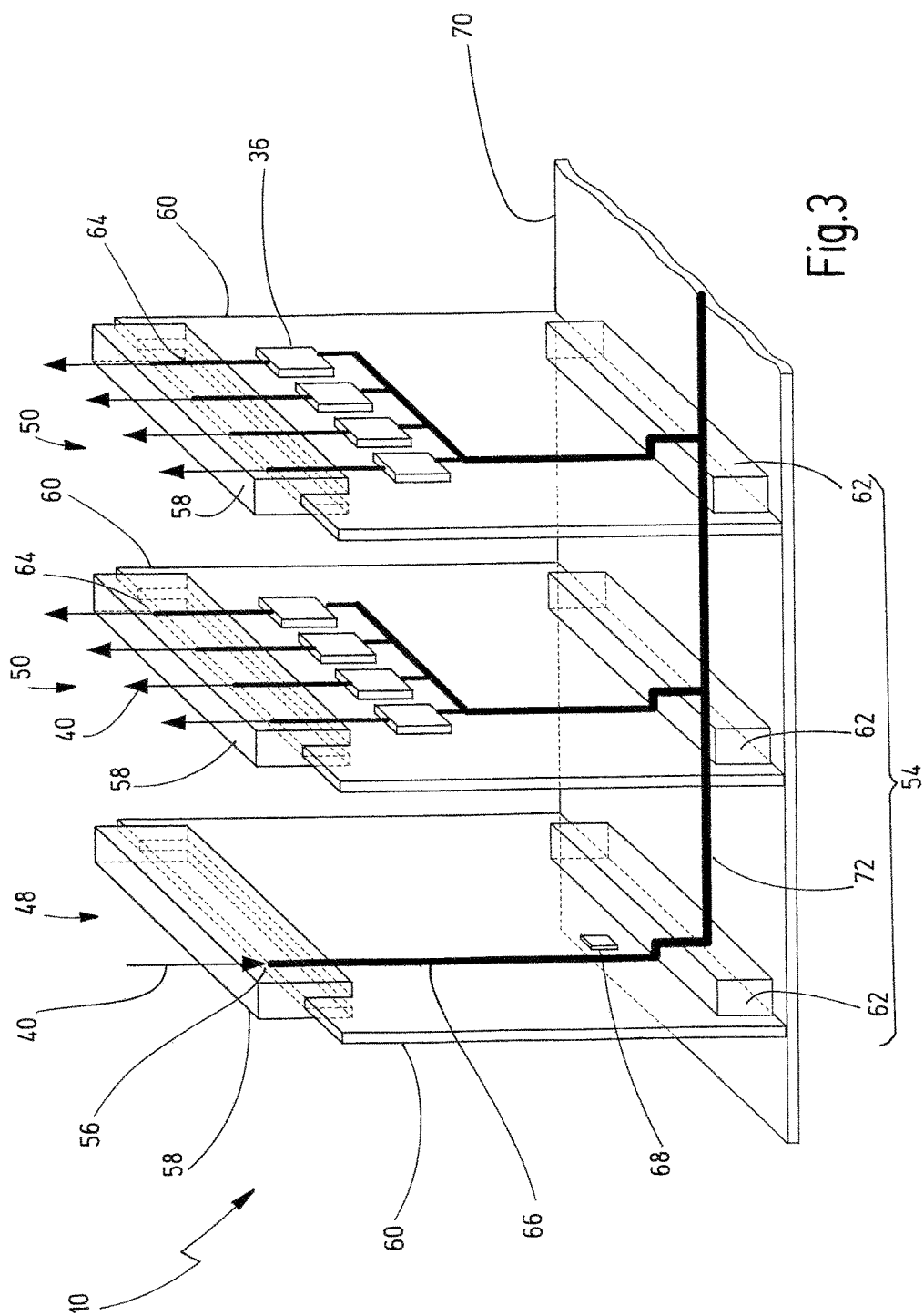
FIG. 3 shows a perspective internal view of a novel control apparatus having supply and peripheral modules.

FIG. 3 shows a perspective illustration of the internal design of an exemplary embodiment of the novel control apparatus. Like reference numerals denote like portions.

FIG. 3 shows a potential group 54. In this case, the potential group 54 comprises a supply module 48 and two peripheral modules (output modules) 50. The modules 48, 50 each have a connection module part 58, an electronic module part 60 and a base module part 62. In this case, the connection module part is indicated in the form of a male connector strip 58 for all the modules. The connection module part 58 of the supply module 48 has in this context a single supply connection 56 that is used to supply a peripheral current to the potential group 54. The connection module parts of the peripheral modules 50 additionally each have four outputs 64 that can be controlled individually via semiconductor switches 36 and that can be used to output the peripheral current 40 that has been picked up by the supply module 48 to the external peripherals.

In this case, the electronic module parts 60 of the peripheral modules 50 are shown as simple printed circuit boards on which the processing units of the peripheral modules 50 are arranged. To simplify matters, only the conductor tracks to the outputs and the corresponding semiconductor switches 36 are indicated in this case. The semiconductor switches 36 can be used by a control unit, not shown in more detail here, to switch the outputs 40. Besides binary on and off switches, it is naturally also possible for other output controllers to be provided, for example analog control of the outputs 40. Furthermore, the electronic module parts 60 of the peripheral modules 50 can contain further EMC components and/or a current limiting section. A current limiting section can be used to determine and stipulate the maximum current that can be picked up by the peripheral modules, for example.

In this case, the electronic module part 60 of the supply module 48 has only one electrical line 66 and one overload identification unit 68, in order to simplify matters. In this case, the electrical line 66 runs in the form of a single conductor track from the supply connection 56 in the connection module part to the base module part 62.

In this case, the base module parts 62 of the supply module 48 and of the peripheral modules 50 are indicated by a plug connection. The individual plug connections 62 are arranged on a backplane 70 through which a bus 72 runs. The bus 72 connects the base module parts 62 of the supply module 48 and of the peripheral modules 50. In this case, the bus 72 is used to forward the peripheral current 40 that is picked up on the supply connection 56 of the supply module 48 to the peripheral modules 50. In a particularly preferred embodiment, the backplane 70 and the bus 72 are formed directly by the base module parts 62. To this end, the base module parts 62 are designed such that, when they are connected beside one another, they form a backplane and provide structures in order to provide at least one bus 72.

In this case, the overload identification unit 68 is arranged on the printed circuit board of the electronic module part 60 of the supply module 48 as close as possible to the electrical line 66, but at any rate in a manner DC isolated therefrom. The distance between the overload identification unit 68 and the conductor track 66 is at least so great that crosstalk as per EMC guidelines cannot take place, but having said that the distance is no greater than three times the cross section of the electrical line 66 so that the overload identification unit 68 can determine a parameter that is representative of the state of the electrical line. Furthermore, the overload identification unit 68 is arranged in direct proximity to the base module part, particularly in the region of the electrical connection to the bus 72. The transition to the bus marks a critical region at which a high line resistance can normally be expected. The high line resistance can arise as a result of wear on contact connections, for example. The overload identification unit is therefore advantageously arranged in the surroundings of the transition.

With reference to FIGS. 4, 5*a*, 5*b* and 5*c*, there follows a more detailed explanation of how an exemplary embodiment of the overload identification unit 68 is designed and how the overload identification unit 68 may be arranged in relation to the electrical line 66.

Figure 4:
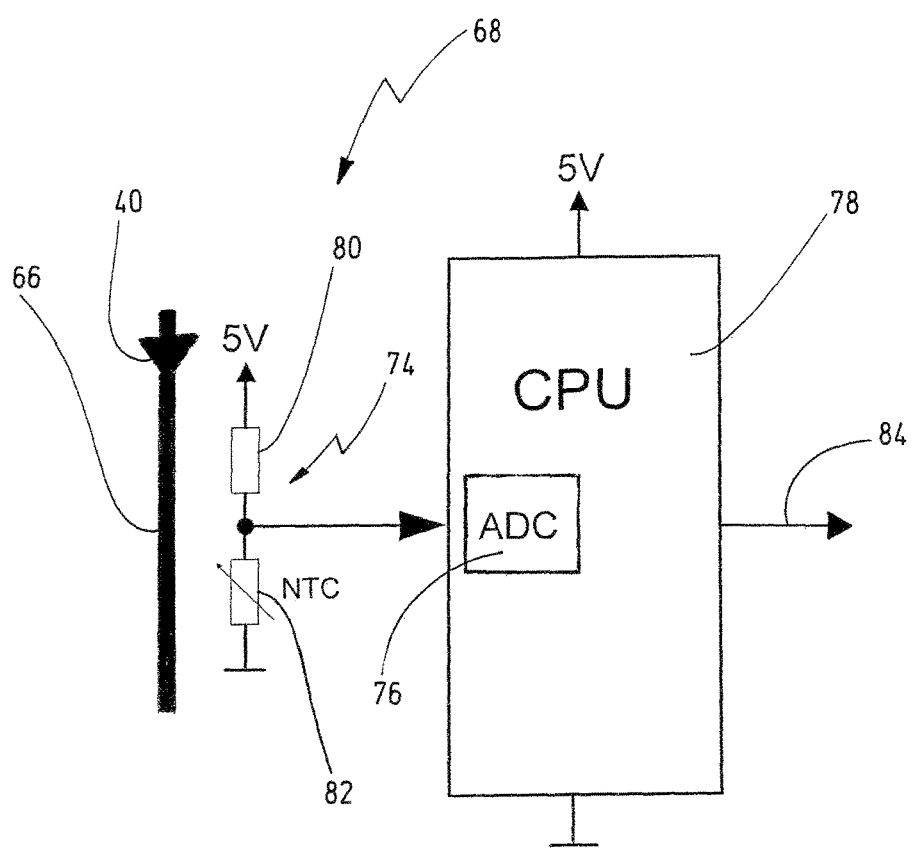
FIG. 4 shows a simplified schematic illustration of an exemplary embodiment of an overload identification unit.

In the exemplary embodiment shown in FIG. 4, the overload identification unit 68 is based on temperature measurement in the immediate surroundings of the electrical line 66. The temperature of the electrical line 66 is definitively determined by the peripheral current 40 flowing through the line 66. The temperature in direct proximity to the electrical line 66 therefore describes the electrical load that flows through the line 66.

In this exemplary embodiment, the temperature is determined by means of a voltage divider 74 that is connected to an analog/digital converter 76 of a microcontroller 78. The voltage divider 74 is formed from a constant resistor 80 and an NTC resistor 82. An NTC resistor 82 is an NTC thermistor, whose electrical resistance has a negative temperature coefficient. At high temperatures, an NTC resistor conducts the electric current better than at low temperatures. The voltage divider 74 and the analog/digital converter 76 can be used by the microcontroller 78 to determine the temperature of the electrical line 66.

As an alterative to an NTC resistor, it is also possible to use a digital temperature sensor in order to determine the temperature. Furthermore, the overload identification unit may also comprise multiple sensors that, in the case of digital sensors, are connected to the microcontroller via a one-wire bus, for example. In this way, it is advantageously possible to determine temperature values at different locations within the supply module.

The microcontroller 78 compares the temperature value (s) with a reference temperature value stored in a memory and produces a warning signal 84 if the picked-up temperature value exceeds the reference value. The warning signal 84 can be processed directly by the supply module 48 or else forwarded particularly to the head module of the modular control apparatus. The head module and/or supply module can take the warning signal 84 as a basis for disconnecting specific outputs or lowering the current consumption of an output module in another way in order to lower the load of a supply module.

FIGS. 5*a*, 5*b* and 5*c* show examples of how the overload identification unit 68 can be arranged on the electrical line 66 in the form of a single sensor. In this case, the electrical line 66 is arranged on a printed circuit board 86 and in this case comprises four conductor tracks A to D that are connected in parallel by plated-through holes 88. The peripheral current 40 is therefore split over four parallel-connected conductor tracks 66, and the load on a single conductor track is reduced. The conductor tracks are preferably evenly distributed over the external and internal layers of the printed circuit board 86.

In this exemplary embodiment, the overload identification unit 68 is indicated by an NTC resistor 82. In this case, the NTC resistor 82 is an SMD component that is arranged on the surface 90 of the printed circuit board 86. The NTC resistor 82 is DC isolated from the conductor tracks 86 of the electrical line. Preferably, however, the NTC resistor 82 is arranged as close to the conductor tracks as EMC provisions allow.

In the exemplary embodiment shown in FIGS. 5*a*, 5*b* and 5*c*, a conductor track of the electrical line 66 has a cutout 92 on the external layer. The NTC resistor 82 is preferably arranged in centered fashion in the cutout 92. The further conductor tracks 66 preferably run in centered fashion below the NTC resistor 82.

FIG. 5*b* shows the exemplary embodiment from FIG. 5*a* in the section through the line A-B. The NTC resistor 82 is arranged centrally on the center perpendiculars of the conductor tracks 66 on the surface 90 of the printed circuit board 86. The cutout 92 allows the temperature sensor to be mounted directly on the surface 90.

FIG. 5*c* shows the exemplary embodiment of FIGS. 5*a* and 5*b* in a plan view. The NTC resistor 82 is arranged in centered fashion in the cutout 92 of the conductor track 66. The distance d between NTC resistor 82 and the conductor track 66 is chosen such that no crosstalk from the peripheral current to the temperature sensor can occur. The NTC resistor 82 is connected by two contacts 94 to an analog/digital converter of a microcontroller or of another evaluation unit preferably via a voltage divider, in order to determine the resistance value or, as a derivation thereof, the temperature of the resistor.

Figure 5:
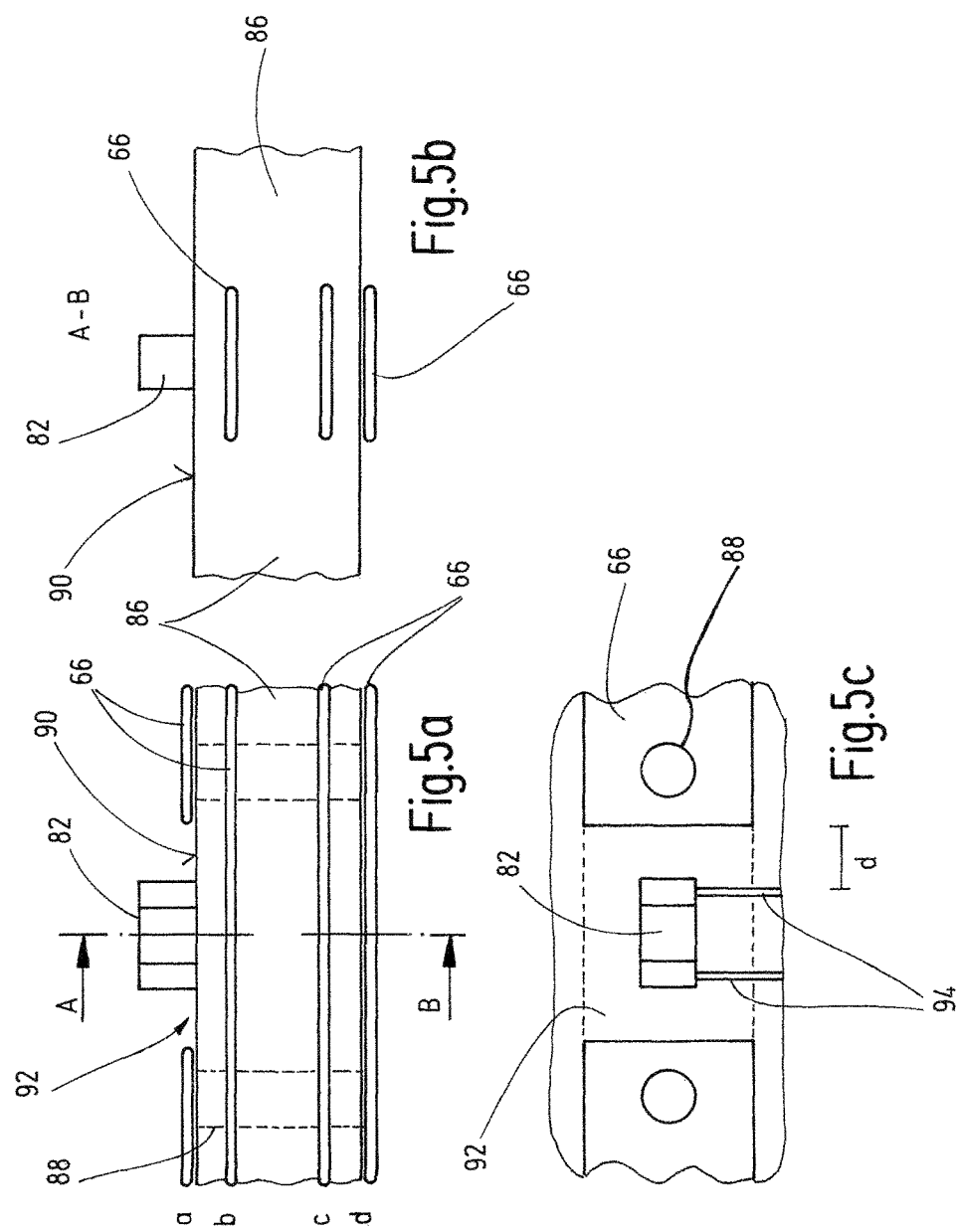
FIG. 5a shows a cross section through an exemplary embodiment of the novel overload identification unit.
FIG. 5b shows a further cross section through an exemplary embodiment of the overload identification unit.
FIG. 5c shows a plan view of an exemplary embodiment of the novel overload identification unit.

In this case, the overload identification unit shown in FIGS. 4 and 5 is only one possible exemplary embodiment of an overload identification unit. Alternatively, a load measurement could also be effected by determining the current in the electrical line 66. By way of example, current measurement can be effected by similarly arranged Hall Effect sensors. In this case, a Hall Effect sensor may be arranged with similar DC isolation to that of an NTC resistor. In another exemplary embodiment, the current can also be measured by a shunt resistor that is connected in series with the conductor tracks. In this case, the measurement is effected using an instrument amplifier and an analog/digital converter on the microcontroller. Since the shunt resistor needs to be electrically connected to the electrical line 66, DC isolation needs to be provided between the measuring device and the evaluation unit.

Advantageously, the different types of sensors can be combined and can be arranged at different locations within the supply module.

Figure 6:
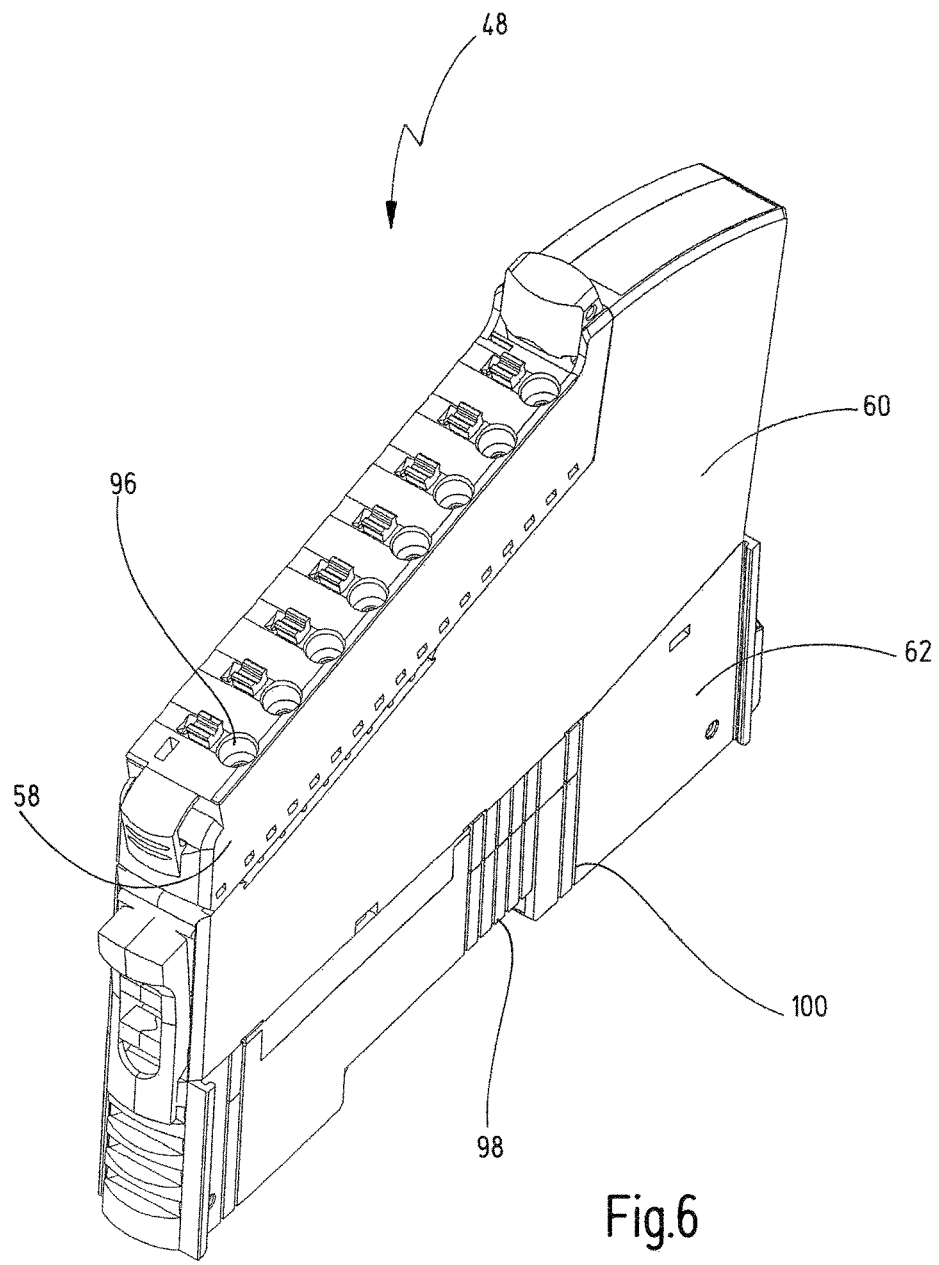
FIG. 6 shows a perspective illustration of an exemplary embodiment of a supply module.

FIG. 6 shows an exemplary embodiment of a single supply module 48. The module comprises a connection module part 58, an electronic module part 60 and a base module part 62. The module parts are mechanically combined to form one unit and electrically connected to one another. Preferably, the function of the module is determined by the electronic module part, while the connection module part and the base module part can also be used for other modules.

In this case, the connection module part 58 has eight connection terminals for external wiring. By way of example, one connection terminal 96 could be used as a supply connection. In particularly preferred exemplary embodiments, the connection module part 58 is part of a prefabricated wiring harness. This allows the modules to be wired in a simple and error-free manner.

The electronic module part 60 contains the processing units of the module. Besides the overload identification unit 82, the electronic module of a supply module may, inter alia, also contain circuit portions for processing the peripheral current, such as a current limiter and/or current smoother for example.

The electronic module part 60 is plugged onto a base module part 62, the base module part 62 providing interfaces to coordinate modules and to the head module. The connection is made via a bus, the structure of which is formed by the individual base module parts 62 of the modules of the control apparatus. To this end, the side of the base module part 62 has contacts 98, 100 that make contact with the coordinate base module parts and loop a bus through them. In the exemplary embodiment shown in FIG. 6, two bus structures are indicated. The first bus, in this case indicated by the contacts 98, forms a data bus that can be used to transmit information from one module to the other and/or to the head module. In this case, the bus indicated with the contacts 100 is a supply voltage bus that is used to transmit the peripheral current. In the exemplary embodiment shown, a peripheral current is therefore picked up via a supply connection, in this case formed from the connection terminals 96, is processed in the electronic module part 60 and is monitored by an overload identification unit according to this disclosure and then forwarded to coordinate modules via the contacts 100 in the base module part 62. If the overload identification unit an overload situation that is brought about by an excessive current on the electrical line between the supply connection and the contacts on the base module part or could be attributed to overheating of the module, the overload identification unit can output a warning signal that is forwarded to the coordinate modules or else particularly to the head module via the data bus on the contacts 98. The head module and/or the associated peripheral modules can then limit the load for the supply module by actuating, particularly disconnecting, outputs of the peripheral modules in order to reduce the load in the supply module.

What is claimed is:

1. A modular control apparatus having a head module, at least one power supply module and at least one peripheral module, which are arranged next to one another on the head module, and having at least one bus structure,
   wherein the at least one power supply module and the at least one peripheral module each have a base module part, an electronic module part and a connection module part, the power supply module being configured to supply the at least one peripheral module with an external peripheral current,
   wherein the connection module part of the at least one power supply module has a supply connection for receiving the external peripheral current,
   wherein the connection module part of the at least one peripheral module provides an output connectable to an actuator for outputting the peripheral current received from the power supply module,
   wherein the base module parts arranged next to one another form the bus structure that electrically couples the head module, the at least one power supply module and the at least one peripheral module to one another so that the external peripheral current is transferred via the bus structure from the at least one power supply module to the at least one peripheral module, and
   wherein the power supply module additionally comprises:
   an electrical line, having a defined cross section, that runs from the connection module part through the electronic module part to the base module part and connects the at least one supply connection of the power supply module to the bus structure,
   and an overload identification unit that is arranged proximate to the electrical line and determines a parameter of the electrical line and produces a warning signal if the parameter exceeds a threshold value.

2. The modular control apparatus according to claim 1, wherein the warning signal is communicated to the head module and the head module disconnects the actuator on at least one output of the at least one peripheral module on the basis of the warning signal.

3. The modular control apparatus according to claim 2, wherein said at least one peripheral module has multiple outputs connected to multiple actuators and the head module disconnects the actuators connected to one or more selected outputs of said at least one peripheral module, but less than all of the multiple actuators connected to said multiple outputs, in response to said warning signal.

4. The modular control apparatus according to claim 1, wherein the overload identification unit has a temperature sensor, particularly an NTC resistor, for indirectly monitoring the current through the electrical line by determining a temperature value for the electrical line.

5. The modular control apparatus according to claim 4, wherein the temperature sensor is thermally coupled to the electrical line but is galvanically isolated from the electrical line.

6. The modular control apparatus according to claim 1, wherein the overload identification unit is arranged at a distance from the electrical line, but the distance corresponds to no more than three times the defined cross section of the electrical line.

7. The modular control apparatus according to claim 1, wherein the overload identification unit determines at least one second parameter, which is of a different kind than the first and which corresponds particularly to the current through the electrical line.

8. The modular control apparatus according to claim 1, wherein the electrical line has a first and at least one second parallel-connected conductor track and the peripheral current is distributed over the first and at least second conductor tracks.

9. The modular control apparatus according to claim 1, wherein the at least one peripheral module has the first output and at least one second output, the first and second outputs being electrically connected to the electrical line of the power supply module.

10. The modular control apparatus according to claim 1, additionally having at least one further peripheral module, wherein the peripheral current is supplied from the power supply module to the first and further peripheral modules.

11. The modular control apparatus according to claim 10, wherein the warning signal is communicated to the head module, and the head module disconnects the actuator connected to the output of the at least one peripheral module but not the peripheral current supplied to said further peripheral modules, in response to said warning signal.

12. The modular control apparatus according to claim 1, wherein the electronic module part of the power supply module has a male connector and the base module part of the power supply module has a corresponding mating connector that, when put together, produce a plug connection that electrically couples the electrical line to the bus structure, the overload identification unit being arranged at the plug connection in galvanically isolated fashion but at a maximum distance that corresponds to three times the cross section of the electrical line.

13. The modular control apparatus according to claim 1, wherein the warning signal is communicated to the head module and the head module generates a further warning signal that is communicated to a user of the modular control apparatus.

14. A method for supplying a peripheral current to a modular control apparatus, having the steps of:
providing a modular control apparatus having a head module, at least one power supply module and at least one peripheral module, which are arranged next to one another on the head module, wherein the at least one power supply module and the at least one peripheral module each have at least one base module part, an electronic module part and a connection module part,
forming a bus structure from the base module parts arranged next to one another that electrically couples the head module, the at least one power supply module and the at least one peripheral module to one another,
providing an electrical line in the at least one power supply module having an overload identification unit, wherein the electrical line has a defined cross section and runs from the connection module part through the electronic module part to the base module part and connects the at least one supply connection of the supply module to the bus structure, and the overload identification unit is arranged proximate to the electrical line,
receiving of an external peripheral current via a supply connection on the connection module part of the at least one power supply module,
outputting the peripheral current via an output on the connection module part of the at least one peripheral module,
defining a threshold value for a parameter of the electrical line,
indirectly monitoring the current through the electrical line by determining the parameter of the electrical line by the overload identification unit, and
generating a warning signal by the overload identification unit if the parameter exceeds the threshold value.

15. The method of claim 14, wherein said at least one peripheral module has multiple outputs connected to multiple actuators, and further including the steps of communicating said warning signal to said head module, and disconnecting via said head module the actuators connected to one or more selected outputs of said at least one peripheral module, but less than all of the multiple actuators connected to said multiple outputs, in response to said warning signal.

16. The method of claim 14, further including the steps of providing at least one further peripheral module, supplying the peripheral current from the power supply module to the first and further peripheral modules, communicating the warning signal to the head module, and disconnecting via said head module the peripheral current supplied to the at least one peripheral module but not the peripheral current supplied to said further peripheral modules, in response to said warning signal.

17. The method of claim 14, further including the steps of communicating the warning signal to the head module and generating via the head module a further warning signal that is communicated to a user of the modular control apparatus.

* * * * *